United States Patent [19]

Jackson et al.

[11] Patent Number: 4,821,269

[45] Date of Patent: Apr. 11, 1989

[54] DIAGNOSTIC SYSTEM FOR A DIGITAL SIGNAL PROCESSOR

[75] Inventors: Richard A. Jackson, Nevada City; David E. Lake, Jr., Penn Valley; James E. Blecksmith, Nevada City; Ronnie D. Barnett, Nevada City; John Abt, Nevada City, all of Calif.

[73] Assignee: The Grass Valley Group, Inc., Grass Valley, Calif.

[21] Appl. No.: 922,367

[22] Filed: Oct. 23, 1986

[51] Int. Cl.⁴ .............................................. G06F 11/00
[52] U.S. Cl. .......................................... 371/16; 371/29
[58] Field of Search ...................... 371/16, 17, 18, 29, 371/15, 20; 364/200 MS File, 900 MS File; 324/73 R, 73 AT

[56] References Cited

U.S. PATENT DOCUMENTS

| 4,371,952 | 2/1983 | Schuck | 371/16 X |
|---|---|---|---|
| 4,381,563 | 4/1983 | Groom | 371/29 |
| 4,606,024 | 8/1986 | Glass | 371/16 |
| 4,621,363 | 11/1986 | Blum | 371/16 X |
| 4,658,354 | 4/1987 | Nukiyama | 371/16 X |
| 4,696,004 | 9/1987 | Nakajima | 371/29 X |
| 4,698,588 | 10/1987 | Hwang | 371/25 X |
| 4,707,833 | 11/1987 | Tamaru | 371/15 |

Primary Examiner—Jerry Smith
Assistant Examiner—Robert W. Beausoliel
Attorney, Agent, or Firm—Francis I. Gray

[57] ABSTRACT

A diagnostic system for a digital signal processor, having an input module, an output module and a plurality of successive processing modules defining a signal processing path, monitors various internal test points within each module. Any one of the test points may be connected to a diagnostic bus. The output of the diagnostic bus may be appropriately modified and input to the output module in lieu of the digital signal from the last processing module to provide a diagnostic display.

9 Claims, 3 Drawing Sheets

DIAGNOSTIC SYSTEM FOR A DIGITAL SIGNAL PROCESSOR

BACKGROUND OF THE INVENTION

The present invention relates to diagnostic systems, and more particularly to a diagnostic system for a digital signal processor which monitors various internal test points of the processor to determine that small portion of the total circuitry which is the source of an error.

When a signal processor fails, it is the job of a maintenance or service person to restore the processor to working order as quickly as possible. The first task in such a job is to generally find the area of the processor within which the malfunction occurred, i.e., the circuit board or module level, and then to replace that module with a spare. This allows the processor to be put back into service while the problem module is repaired off-line or during a planned maintenance period. Even where there are no spare modules available so that repairs have to be made on-line, the ability to quickly narrow the fault to a limited range of circuitry greatly speeds the repair process, decreasing the overall downtime of the processor.

Most problems in signal processors involve a known good signal, or set of signals, at the input of the processor generating a bad signal, or set of signals, at the output. By tracing along the internal signal path of the processor from input to output the service person can usually determine the faulty circuit by noting when the good signal turns bad. Conversely the signal path may be traced from the output toward the input and noting when the bad signal becomes good. If this tracing is done in discrete steps, for example at the input and output of each functional or physical module, the faulty module can quickly be identified as the circuitry between here the signal was good and where it started to go bad.

When the processor processes signals in analog form, the signal path is relatively easy to follow since the signal usually is represented by a single wire or point. This point can be probed with various types of test equipment, such as oscilloscopes and the like, to give the service person an easy means for reading the status of the signal. When the internal processing is digital, however, a given signal may exist as many discrete wires, or many bits of data multiplexed on a single wire, all of which must be simultaneously taken into account to derive an indication of that signal's status. Except for the most trivial problems, this is beyond the ability of oscilloscopes and usually requires more complex test equipment, such as logic analyzers and the like.

These more complex test instruments take longer to set up, since individual probes must be attached to each wire of the signal path, and are usually limited to single "snapshots" of a signal at a time. The "snapshot" is then analyzed by the service person. If the problem is intermittent in nature, the chance of having the failure occurring during one of the "snapshots" is low, adding to the total service time.

A desirable alternative world be to display various test points in a form with which the service person is familiar. In the case of a digital audio signal processor this might be analog audio. In the case of a digital video signal processor the preferred output would be video pictures. Since the original fault was probably initially identified by listening to or looking at the output of the processor, if the internal test points could also be displayed at the output on the same monitoring equipment, it would aid in recognizing whether the signal at a given test point is good or bad.

SUMMARY OF THE INVENTION

Accordingly the present invention provides a diagnostic system for a digital signal processor which monitors various internal test points of the processor. A plurality of switches connect the test points to a diagnostic bus upon appropriate command. The diagnostic bus is connected to the output via a diagnostic switch so that the digital signal at any test point within the processor may be displayed. The data on the diagnostic bus may first access a lookup table prior to the output, and necessary sync pulses may be added to assure a stable output display.

The objects, advantages and other novel features of the present invention will be apparent from the following detailed description when read in conjunction with the appended claims and attached drawing.

DESCRIPTION OF THE PREFERRED EMBODIMENT

Figure 1:
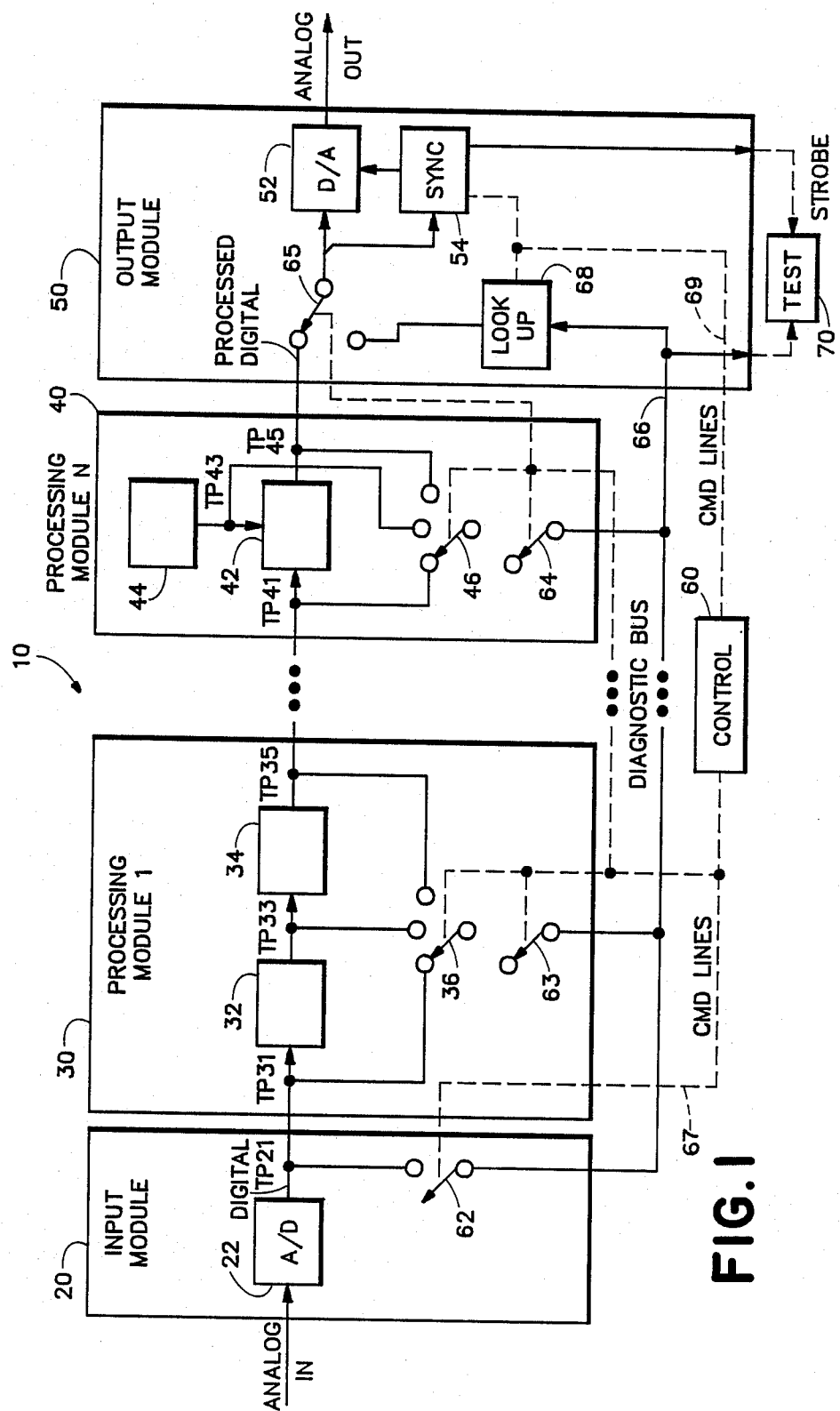
FIG. 1 is a block diagram view of a digital signal processor incorporating a diagnostic system of the present invention.

Referring now to FIG. 1 a digital signal processor 10, such as a digital video effects generator, has a plurality of modules which make up a signal path. An input module 20 receives an analog input signal, such as an analog video signal from a camera, video tape recorder or the like, and converts the analog signal to a digital signal in an analog to digital converter 22. The resulting digital signal is input to a first processing module 30 where various manipulations are performed upon the digital signal, such as deinterlacing, transformations, etc., by various circuits 32, 34. The output of the first processing module 30 is input to subsequent processing modules for additional signal processing. The output from the Nth processing module 40 is input to an output module 50 where the processed digital signal is converted to an analog output, such as a processed video picture, by digital to analog converter 52 for subsequent display on a monitor. A timing circuit 54 also receives a portion of the processed digital signal which contains timing data synchronized with the digital signal to provide timing signal inputs, such as horizontal and vertical sync pulses for a television system, to the D/A converter 52 as are appropriate to provide a recognizable, stable display of the analog output.

A service person interacts with a diagnostic system incorporated into the digital signal processor 10 via a controller 60. The controller 60, or operator interface, may consist of front panel switches, which provide input to an internal microprocessor, or a computer terminal connected to the digital signal processor 10. The diagnostic system has a diagnostic bus 66 which is connected to a plurality of module selection switches 62, 63, 64. For modules with more than one internal test point, a test point selection switch 36, 46 is provided for each module, the test point selection switch being connected in turn to the respective module selection switch 63, 64. As shown in FIG. 1 the input module 20 has a single test point TP21 at the output of the A/D converter 22 which is connected to the input module select switch 62. The first processing module 30 has three test points TP31, TP33, TP35 at the respective inputs and outputs of the internal circuits 32, 34, which test points are connected to the first processing module test point selection switch 36. Likewise the Nth processing module 40 has illustrated three test points TP41, TP43, TP45 at the input and/or output of respective internal circuits 42, 44, which test points are connected to the Nth processing module test point selection switch 46. As is shown not all circuits being monitored process the digital signal. For example the circuit 44 in the Nth processing module represents a general function generator which might provide an input to processing circuit 42. Thus upon appropriate operator input to the controller 60, or automatically, any test point within the digital signal processor 10 may be connected to the diagnostic bus 66. However, by an appropriate interlocking structure, as is well known in the art, only one test point can be connected to the diagnostic bus at any given time.

In the output module 50 an output diagnostic switch 65 selects the input for processing by the output module. In normal operation the processed digital signal is connected via the diagnostic switch 65 to the D/A converter 52 and timing circuit 54. However, during diagnostic operation the diagnostic bus 66, via a diagnostic transformation circuit 68, is connected to the D/A converter 52 and timing circuit 54 via the diagnostic switch 65. Thus any of the internal test points can be displayed at the output of the digital signal processor 10 by a service person without interrupting the internal digital processing of the processor. The controller 60 is connected via appropriate command lines 67, 69 to the switches, the diagnostic transformation circuit 68, and the timing circuit 54. It should be noted that the test point and corresponding module selection switches may be combined into a single switch, as is evident to one skilled in the art. Also output from the output module 50 is a STROBE pulse from the timing circuit 54 to provide a trigger to an external test instrument 70, such as a logic analyzer, which is connected to the diagnostic bus 66, the STROBE pulse corresponding to a particular sample or pixel within the digital signal.

Figure 2:
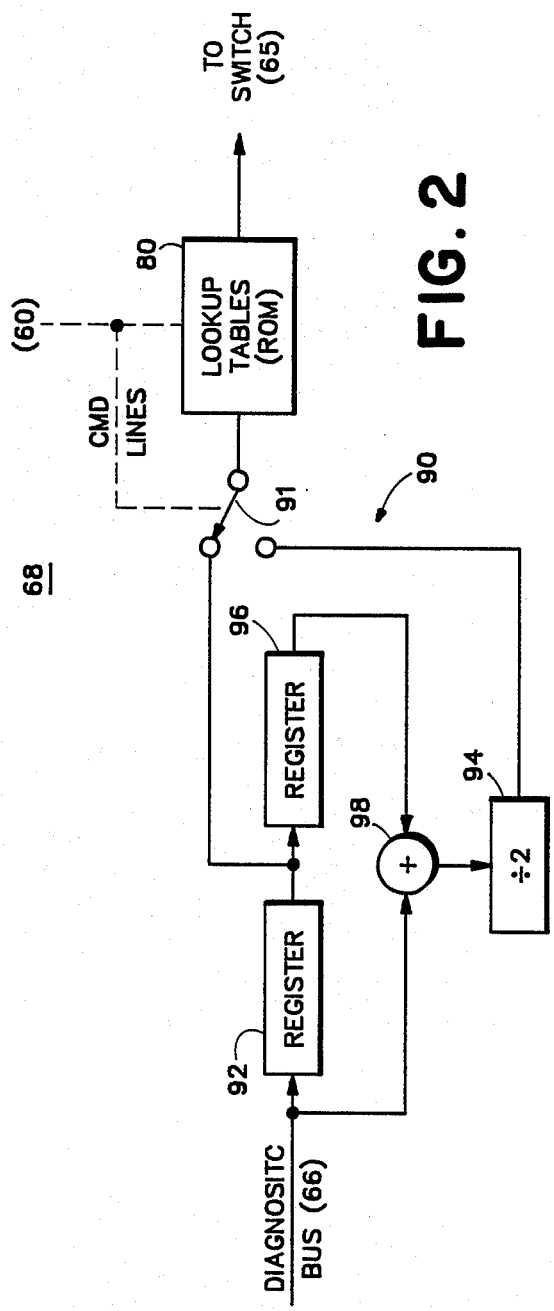
FIG. 2 is a block diagram view of a diagnostic transformation circuit for the diagnostic system of FIG. 1.

It is often the case that several different forms of signals may exist within the digital signal processor 10 that need to be monitored. These signals may vary in format, level and/or transmission mode. When a common output monitor is used, such as a television video screen, it is desirable to translate one or more of these different signals to a common format so that the operator gets a visual representation of the various signals without having to readjust the monitor for each different format. For example in video processing a key signal may vary in level as it passes from stage to stage within the processor 10. As shown in FIG. 2 the signal from the diagnostic bus 66 is input to a first register 92 within the diagnostic transformation circuit 68. The output of the first register 92 is output via a switch 91 to a lookup table memory 80 which contains a plurality of lookup tables, including a unity table. The selection of the appropriate lookup table within the lookup table memory 80, generally stored in ROM, may be used to automatically level shift the output of the diagnostic bus 66 depending on the selected test point. The appropriate lookup table from the lookup table memory 80 may also be used to make a "meaningful" display of non-video information, such as addresses or control data. The output of the diagnostic bus 66 for these functions would be mapped into a black to white display that would be meaningful to the operator. Another common form of signal to be monitored is one in which two independent waveforms have been time multiplexed together, such as the U and V components of chrominance in a television signal. It is usually more meaningful to an operator to be able to examine the component waveforms independently than to look at the time multiplexed combination, so a demultiplexer 90 is required. Although the demultiplexer 90 is shown as part of the diagnostic transformation circuit 68, individual demultiplexers may be placed in each module prior to the respective module switches to perform the demultiplexing and interpolating function of the digital signal from the selected test point prior to the diagnostic bus 66. FIG. 2 shows a combination demultiplexer and interpolator for two way interleaved signals, the interpolator being used to fill in the gaps between demultiplexed samples, which may also be done by reducing the output clock rate of the D/A sections and following filters of the D/A converter 52 at the cost of additional complexity. The demultiplexer output switch 91 alternates between the output of the first register 92 and the output of a divider 94. When switched to the output of the first register 92, the output at the switch 91 is the input multiplexed sample delayed one clock cycle. When switched to the output of the divider 94, the output is the average of two adjacent common samples as developed by a second register 96, an adder 98 and the divider 94 as is well known to those in the art. Other systems could alternately use higher order interpolators and/or more complex demultiplexers for multiplexed signals of higher order, i.e., three way, four way, etc.

Figure 3:
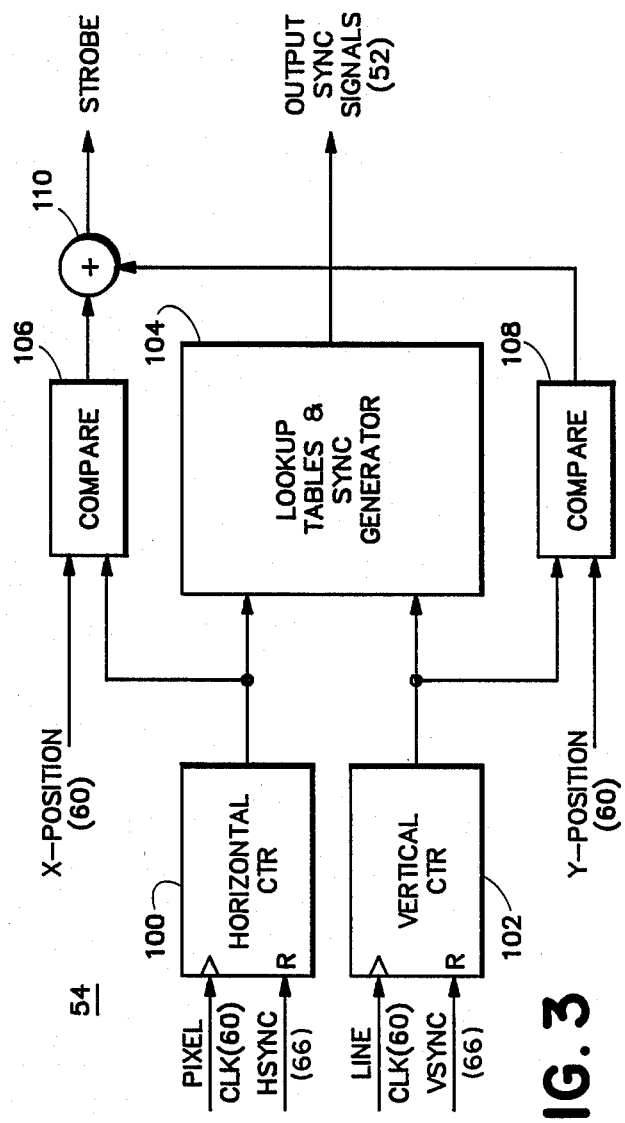
FIG. 3 is a block diagram view of a timing circuit for the diagnostic system of FIG. 1.

A digital signal is subject to delays at each processing stage through the processor 10. When this occurs the output of the diagnostic bus 66 varies in time relative to a fixed external point, such as the input signal, as various test points are selected. This makes it difficult to monitor a given sample, or pixel, as it traverses the processor 10 unless some reference is used that also varies in time by the same amount from test point to test point. FIG. 3 shows a system by which a horizontal and vertical timing reference, obtained from the diagnostic bus 66, is used to drive a set of counters 100, 102 in synchronization with the incoming diagnostic digital signal. The horizontal counter 100 is clocked by a column, or pixel, clock from the controller 60, and the vertical counter 102 is clocked by a row, or line, clock from the controller. The timing data, such as horizontal and vertical sync, from the diagnostic bus 66 resets the counters 100, 102 which then count up. Each test point provides to the diagnostic bus 66 timing data as well as the digital signal, the timing data having been delayed the same amount as the digital data, i.e., the timing data is in time sync with the test point digital signal. The outputs of the counters 100, 102 are decoded by a lookup table and sync generator 104 to give some set of synchronizing signals, such as video sync. To obtain the STROBE pulse for use by external test instruments 70 the output of the counters 100, 102 are input to respective comparators 106, 108. The other input to the comparators 106, 108 are X-position and Y-position commands from the controller 60 which define the sample or pixel upon which a trigger is desired. The outputs of the comparators 106, 108 are input to a combining circuit 110 so that the STROBE pulse occurs only when the desired sample is present on the diagnostic bus 66. Also the timing circuit 54 shown in FIG. 3 is used for "two-dimensional" signals, such as video. Other forms of signals, such as audio, may only use one set of counters, or more sets of counters may be needed by more advanced signals. Although only one signal path is shown in the FIGS., in reality each signal path may consist of one or more components, such as luminance, chrominance and key in a digital video effects system, with each component having one or more parallel bits, usually 8-10 bits plus synchronizing or timing bits.

In operation a service person decides whether or not to turn on the diagnostic system via switch 65 when a fault is suspected, and determines which module and test point within that module to connect to the diagnostic bus 66 for display. The controller 60 automatically conditions the appropriate circuits within the diagnostic transformation circuit 68 and the timing circuit 54 to apply appropriate offsets, timing pulses and/or transformations to the signal on the diagnostic bus 66 so that the signal may be appropriately displayed in a recognizable and stable manner. Alternatively the diagnostic system may operate automatically upon initiation by the operator to sample each test point in turn and record the resulting information on the test instrument 70.

Thus the present invention provides a diagnostic system for digital signal processing equipment which monitors various internal test points of the equipment to allow a service person to quickly determine that portion of the total processor circuitry which is the source of a fault.

What is claimed is:

1. A diagnostic system for a signal processor, the signal processor having an input module, an output module and a plurality of successive processing modules to form a path for processing an input signal, comprising:
    a diagnostic bus;
    means for selecting one of the modules and a test point within the selected module for connection to the diagnostic bus;
    means for switching the input to the output module between the output of the diagnostic bus and the output of the last processing module; and
    means for modifying the output of the diagnostic bus prior to input to the output module so that the output from the diagnostic bus is compatible with the input to the output module, the output from the output module representing the selected test point.

2. A diagnostic system as recited in claim 1 wherein the modifying means comprises a lookup table memory for translating the format of the output from the diagnostic bus to one compatible with the input to the output module.

3. A diagnostic system as recited in claim 2 wherein the coupling means further comprises means for selecting between a plurality of tables contained within the lookup table memory, the selected table being applied to the output of the diagnostic bus according to the test point selected by the module and test point selecting means.

4. A diagnostic system as recited in claim 1 wherein the modifying means comprises means for separating a portion of the output of the diagnostic bus, the separated portion being input to the output module.

5. A diagnostic system as recited in claim 4 wherein the coupling means further comprises means for selecting which portion of the output of the diagnostic bus is input to the output module.

6. A diagnostic system as recited in claim 1 wherein the modifying means further comprises means for applying appropriate timing to the output of the diagnostic bus to compensate for time delays in the signal processing path.

7. A diagnostic system as recited in claim 6 wherein the coupling means further comprises means for generating appropriate timing signals for addition to the output of the diagnostic bus according to the test point selected by the module and test point selecting means to compensate for the processing delay at the selected test point.

8. A diagnostic system as recited in claim 6 wherein the applying means further comprises means for generating a strobe at a particular point within the output of the diagnostic bus to allow a specific value to be captured by a test instrument connected to the output of the diagnostic bus.

9. A diagnostic system as recited in claim 1 wherein the selecting means comprises:
    a test point switch for selecting between a plurality of test points within the selected module to connect the selected test point from the selected module to the diagnostic bus; and
    means for controlling the selection of modules and test points such that only one test point is selected for connection to the diagnostic bus at any given time.

* * * * *